United States Patent
Brofman et al.

[11] Patent Number: 5,968,670
[45] Date of Patent: Oct. 19, 1999

[54] ENHANCED CERAMIC BALL GRID ARRAY USING IN-SITU SOLDER STRETCH WITH SPRING

[75] Inventors: Peter J. Brofman, Hopewell Junction; Patrick A. Coico, Fishkill; Mark G. Courtney; James H. Covell, II, both of Poughkeepsie; Shaji Farooq, Hopewell Junction; Lewis S. Goldmann, Bedford; Raymond A. Jackson; David C. Linnell, both of Poughkeepsie; Gregory B. Martin, Wappingers Falls; Frank L. Pompeo, Montgomery; Kathleen A. Stalter, Hopewell Junction; Hilton T. Toy, Wappingers Falls, all of N.Y.

[73] Assignee: International Business Machines Corporation, Armonk, N.Y.

[21] Appl. No.: 08/909,864

[22] Filed: Aug. 12, 1997

[51] Int. Cl.⁶ .............................. H01L 21/60; B23K 35/14
[52] U.S. Cl. .......................... 428/576; 428/592; 428/614; 228/180.22; 228/56.3
[58] Field of Search .................................... 428/614, 576, 428/592; 228/180.22, 56.3, 189, 249; 257/780, 738

[56] References Cited

U.S. PATENT DOCUMENTS

| | | |
|---|---|---|
| 3,509,270 | 4/1970 | Dube et al. . |
| 3,616,532 | 11/1971 | Beck . |
| 3,811,186 | 5/1974 | Larnerd et al. . |
| 3,921,285 | 11/1975 | Krall . |
| 4,878,611 | 11/1989 | LoVasco et al. . |
| 5,148,968 | 9/1992 | Schmidt et al. . |
| 5,222,014 | 6/1993 | Lin . |
| 5,284,796 | 2/1994 | Nakanishi et al. . |
| 5,431,328 | 7/1995 | Chang et al. . |
| 5,441,195 | 8/1995 | Tustaniwskyi et al. . |
| 5,466,635 | 11/1995 | Lynch et al. . |
| 5,541,450 | 7/1996 | Jones et al. . |
| 5,639,696 | 6/1997 | Liang et al. . |

OTHER PUBLICATIONS

IBM Technical Disclosure Bulletin, Vol. 19, No. 4, Sep. 1976, "Chip Support Assembly", pp. 1178–1179.
IBM Technical Disclosure Bulletin, Vol 27, No. 3, Aug. 1984, "Process for Elongating Semiconductor Device Solder Connections", p. 1579.
IBM Technical Disclosure Bulletin, Vol. 27, No. 10B, Mar. 1985, "Centrifugal Stretching of C4 Joints", pp. 6198–6200.

Primary Examiner—John J. Zimmerman
Assistant Examiner—Jason Savage
Attorney, Agent, or Firm—DeLio & Peterson LLC; John J. Tomaszewski; Aziz M. Ahsan

[57] ABSTRACT

A method and apparatus are provided for forming an elongated solder joint between two soldered substrates of an electronic module or an electronic module in the process of being fabricated by using expandable solder bump means disposed between the substrates. The expandable solder bumps means comprise solder having a higher reflow temperature than the solder used to join the substrates and expansion means such as a compressed spring encased within the solder and are activated (expanded) by reflowing at a higher temperature than the melting point temperature of the solder joints.

17 Claims, 5 Drawing Sheets

ENHANCED CERAMIC BALL GRID ARRAY USING IN-SITU SOLDER STRETCH WITH SPRING

BACKGROUND OF THE INVENTION

1. Field of the Invention

This invention relates generally to electrically and mechanically interconnecting one electronic component to another electronic component to form an electronic assembly or module and, in particular, to stretching or otherwise deforming the solder joints of an existing module or a module in the process of being made to form elongated solder joints having enhanced mechanical and electrical integrity and reliability.

2. Description of Related Art

Forming an electronic package assembly whereby an electronic component such as an integrated circuit chip is electrically connected to a substrate such as a card, or board, another chip or another electronic part is well-known in the art. Surface mount technology (SMT) has gained acceptance as the preferred means of joining electronic package assemblies. The following description for convenience will be directed to joining ceramic electronic components such as multilayer ceramic components as exemplified by integrated circuit chips to printed circuit cards or boards.

Multilayer ceramic electronic components are typically joined together by soldering pads on a surface of one of the electronic components to corresponding pads on the surface of the other component. Control Collapse Chip Connection is an interconnect technology developed by IBM as an alternative to wire bonding. This technology is generally known as C4 technology or flip chip packaging. Broadly stated, one or more integrated circuit chips are mounted above a single or multiple layer ceramic substrate or board and pads on the chip are electrically or mechanically connected to corresponding pads on the other substrate by a plurality of electrical connections such as solder bumps. The integrated circuit chips may be assembled in an array such as a 10×10 array.

In the C4 interconnect technology, a relatively small solder bump is attached to pads on one of the components being joined. The electrical and mechanical interconnects are then formed by positioning the corresponding pads on the other electronic component adjacent the solder bumps and reflowing the bumps at an elevated temperature. The C4 joining process is self-aligning in that the wetting action of the solder will align the chip bump pattern to the corresponding substrate pads.

A myriad of solder structures have been proposed for the surface mounting of one electronic structure to another. Typical surface mount processes form the solder structures by screening solder paste on conductive, generally metallic pads exposed on the surface of the first electronic structure or substrate. A stencil printing operation is used to align the contact mask to the pads. The solder paste is reflowed in a hydrogen atmosphere and homogenizes the pad and brings the solder into a spherical shape. The solder spheres on the substrate are then aligned to corresponding pads on the electronic structure or board to be connected thereto. After alignment, the substrate and board go through a reflow operation to melt the solder and create a solder bond between the corresponding pads on the substrate and other electronic components. The interconnection is typically in a form of a double truncated sphere as shown in FIG. 5.

Other known surface mount technology uses solder balls rather than solder paste to provide the solder connecting structures. By using solder balls, a more exact and somewhat greater quantity of solder can be applied than from screening. The solder balls are aligned and are held to a substrate and melted to form a solder joint on a conductive pad of the substrate. As before, the substrate with the newly joined solder balls is aligned to the board to be connected therewith and the solder balls are then reflowed to perform a solder bond between the two substrates. The use of a copper ball surrounded by eutectic solder is also used as a solder joint structure for attaching a multilayer ceramic (MLC) substrate to a PC laminate wherein the ball serves as a standoff.

The C4 joint technology, commonly also referred to as ceramic ball grid array technology (CBGA), offers advantages of low cost, and a low inductance surface mounting interconnection. However, a thermal expansion mismatch between the chip and substrate will cause a shear displacement to be applied on each solder connection. Over the lifetime of a module, this leads to an accumulated plastic deformation and decreases the lifetime of the module. The typical solder joint has the shape of a double truncated sphere which is truncated at each end by contact with the pad and is known to have a limited lifetime due to the thermal mismatch between the substrates and the shape of the bump. It has been found that changes in shape away from a spherical segment can produce increased joint stability and mechanical testing has shown an order of magnitude difference in fatigue life between an hour-glass shape and a barrel-shape (double truncated spherical) joint with the fracture location in an hour-glass joint shifted to the center of the joint instead of at the pad-joint intersection.

Stretched solder joints have been fabricated by a number of techniques including using different solders on the same chip. Solder columns have also been stacked to achieve improved fatigue life. Two solder alloys have been used in combination wherein the surface tension of a larger bump is used to raise and stretch the smaller area of the joints. Another approach involves stacking C4 bumps using polyimide interposers, but this technique adds considerable cost and manufacturing complexity without improved benefit.

A centrifugal force technique has also been employed wherein modules having C4 solder joints are heated and spun such that the C4s are elongated while molten. This technique has obvious manufacturing difficulties when using large printed circuit cards. Expansion brackets attached to one of the substrates has also been used to stretch the C4 joints. Basically, the bracket, when activated by heat or other means, raises one of the substrates in the z-axis (vertically) stretching the C4 connection. The bracket, however, becomes an integral part of the final structure requiring the packaging design to incorporate the bracket and related fixturing.

Bearing in mind the problems and deficiencies of the prior art, it is therefore an object of the present invention to provide a method of forming an elongated solder joint between two solder interconnected substrates in an electronic module to enhance the mechanical and electrical integrity and reliability of the module.

It is another object of the present invention to provide an apparatus for forming an elongated solder joint between two solder interconnected substrates of an electronic module to enhance the mechanical and electrical integrity and reliability of the module.

A further object of the invention is to provide electronic modules having solder joints having enhanced mechanical and electrical integrity and reliability.

It is yet another object of the present invention to provide an electronic component assembly or module made using the method and apparatus of the invention.

Another object of the invention is to provide an article of manufacture for use in fabricating electronic modules which article may be used to form elongated solder joints in the module.

Other objects and advantages of the invention will be readily apparent from the description.

SUMMARY OF THE INVENTION

The above and other objects, which will be apparent to those skilled in the art, are achieved in the present invention which is directed in a first aspect to a method of forming elongated solder joints in an existing electronic module or in an electronic module in the process of being made whereby the module has a first substrate and a second substrate joined by solder joints, the method comprising steps of:

forming a plurality of first solder bumps on the first substrate, the first solder bumps having a first melting point and a first initial height;

forming a plurality of expandable solder bumps uniformly spaced on the first substrate, the expandable solder bumps preferably having a height less than the first initial height of the first solder bumps and comprising a solder paste having a melting point higher than the first melting point of the first solder bumps and integral expansion means which expansion means expand vertically when activated and increase the height of the first solder bumps to a height greater than the first initial height of the first solder bumps;

positioning the second substrate to align with the first solder bumps of the first substrate;

heating the first substrate and second substrate to reflow the first solder bumps to form a first solder interconnection between the first substrate and the second substrate the reflow being at a temperature less than the melting point of the expandable solder bumps; and heating the interconnected first substrate and second substrate to reflow the expandable paste solder bumps to expand the expansion means increasing the height of the first solder interconnection forming the elongated solder joints of the electronic module.

In a further aspect, the present invention relates to a method of forming an expandable solder bump for an electronic module comprising the steps of:

a) providing a cavity in a mold having a desired height and configuration for an expandable solder bump;

b) filling the cavity with a solder paste;

c) inserting a spring into the cavity, the spring having an uncompressed height greater than the height of the cavity;

d) compressing the spring to a height no greater than the height of the cavity;

e) heating the compressed spring and solder paste in the cavity to melt the solder paste; and f) cooling the spring and solder paste to solidify the solder paste and form a solder structure having integrally encased therein the spring in a compressed state.

Another aspect of the invention provides a method of forming an elongated solder joint between two solder interconnected substrates in an electronic module comprising the steps of:

a) forming a plurality of first solder bumps on one side of a first substrate, the solder bumps having a first melting point and a first height;

b) forming a plurality of expandable solder bumps on the one side of the first substrate, the expandable solder bumps comprising a solder structure having integrally encased therein expansion means in a compressed state, the expansion means being adapted to expand from the compressed state when the expandable solder bumps are reflowed, the expandable solder bumps having a second melting point, the second melting point of the expandable solder bumps being greater than the first melting point of the first solder bumps, the expandable solder bumps have an initial height less than that of the first solder bumps;

c) positioning a second substrate to align with and contact the first solder bumps of the first substrate;

d) heating the first solder bumps to a temperature less than the melting point of the expandable solder bumps to reflow the first solder bumps to form a first solder interconnection between the first substrate; and e) heating the expandable solder bumps and the first solder bumps to a temperature above the melting point of the expandable solder bumps to reflow and expand the expandable solder bumps thereby increasing the height of the first solder interconnection and forming an elongated solder joint between the substrates.

Preferably, in step (e) the first solder bumps are expanded to form an hour-glass shape after reflow. Also, in step (a) the first solder bumps are preferably formed on the first substrate by heating the first solder bumps to a temperature less than the second melting point of the expandable solder bumps, and in step (b) the expandable solder bumps are preferably formed on the first substrate by heating the expandable solder bumps while the solder structure is in contact with the one side and the expansion means is constrained in a compressed state.

In a further aspect of the invention, an article of manufacture is provided for increasing the height of solder joints in an electronic module comprising:

a first substrate having a plurality of first solder bumps on the first substrate, the first solder bumps having a first melting point and a first initial height; and a plurality of expandable paste solder bumps on the first substrate the expandable solder bumps having a second melting point greater than the first melting point of the first solder bumps and preferably having a height less than the first initial height of the first solder bumps.

In an additional aspect of the invention, the above article is aligned with:

a second substrate and reflowed at the first melting point temperature forming a first solder interconnection between the first substrate and the second substrate wherein when the interconnected first substrate and second substrate are reflowed at the second solder melting point temperature, the expandable solder bumps expand increasing the height of the interconnection to greater than the first initial height.

In a further aspect, the present invention relates to an article of manufacture for use in fabrication of an electronic module having solder interconnected substrates comprising a first substrate and a plurality of first solder bumps on one side of the first substrate. The article also comprises a plurality of expandable solder bumps on the one side of the first substrate. The expandable solder bumps have a solder structure having integrally encased therein expansion means in a compressed state, the expansion means being adapted to expand from the compressed state when the expandable solder bumps are reflowed. The melting point of the expandable solder bumps is greater than the melting point of the first solder bumps and the expandable solder bumps have an initial height less than that of the first solder bumps.

In yet another aspect, the present invention provides an electronic module having solder interconnected substrates comprising a first substrate, a second substrate, and a plurality of first solder joints connecting the first and second substrates, wherein the solder joints have an elongated configuration after reflow from an initial height. A plurality of expandable solder joints connect the first and second substrates. The expandable solder joints have integrally encased therein expansion means in a solder structure, the expansion means being in an expanded state after reflow from an initial height. The expandable solder joints have a melting point greater than the melting point of the first solder joints.

In another aspect, the present invention relates to an article of manufacture for use in fabrication of an electronic module having solder interconnected substrates comprising a solder structure having integrally encased therein expansion means in a compressed state, the expansion means being adapted to expand from the compressed state when the solder structure is reflowed. The expansion means preferably comprises a spring, and the solder structure may have a cylindrical configuration.

In an additional aspect of the invention, an electronic module is provided having stretched solder joints made by the above method and using the article of manufacture. The stretched electronic component module will typically have an hour-glass shaped stretched solder joint between the two solder interconnected substrates which shape is formed by the stretching action of the expandable solder bumps employed between the first and second substrates.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
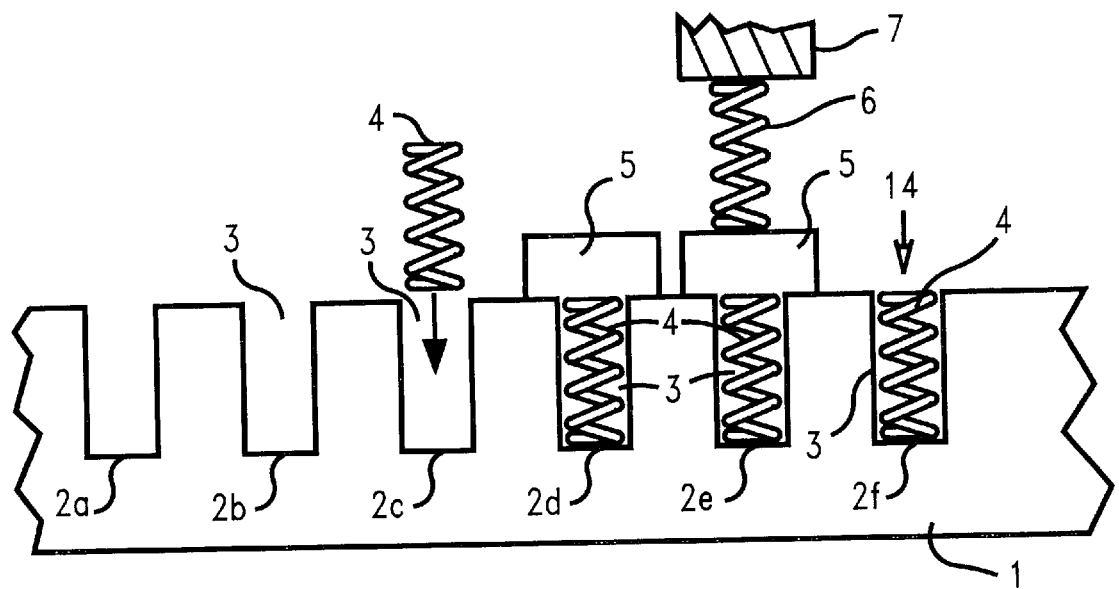
FIG. 1 is a sectional elevational view of a graphite boat showing the various steps in the fabrication of the expandable solder column or bump in accordance with the present invention.

In describing the preferred embodiment of the present invention, reference will be made herein to FIGS. 1–6 of the drawings in which like numerals refer to like features of the invention. Features of the invention are not necessarily shown to scale in the drawings.

In FIG. 1 there is shown the various steps of forming the preferred expandable solder bumps in accordance with the present invention. The steps are shown in connection with cavities 2a–2f in graphite boat mold 1, with each cavity representing a different step. Cavity 2a (step a) is initially shaped in accordance with the final configuration of the expandable solder bump, for example, as a cylinder. In cavity 2b (step b) there deposited solder paste 3 to fill the cavity. A spring 4 having a relaxed (uncompressed) length greater than the height of cavity 2c is positioned over the cavity (step c) and is inserted into the paste in cavity 2d (step d) and held therein in a compressed state by glass slide 5. Spring 4 should be made of a material such as spring steel which will not relax when heat treated at the liquidus temperature of the solder paste 3. In cavity 2e (step e), an external spring 6 affixed to a fixture 7 bears against slide 5 and holds the spring 4 constrained in paste 3 as the paste is heated to an elevated temperature to reflow (melt) the solder paste. After cooling, spring 4 is restrained in its compressed state in solidified solder 3 forming cylindrical expandable solder column or bump 14, which may be removed from graphite boat 1 for use.

Figure 2A:
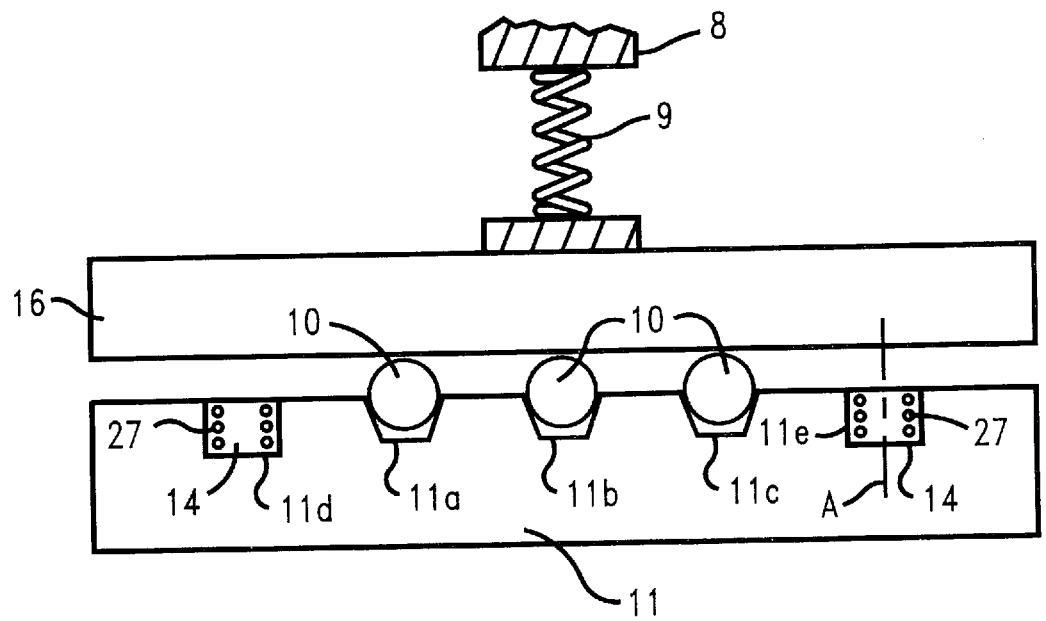
FIGS. 2A–2E show in sectional elevational views the steps of interconnecting substrates with the solder bump formed in FIG. 1.

Referring to FIGS. 2A–2E, a sequence of steps is shown to form an electronic module having stretched solder joints made according to the method of the invention. In FIG. 2A, a graphite boat 11 having openings or cavities 11a, 11b, 11c is positioned under substrate 16. Solder balls 10 are shown inserted in openings 11a, 11b, 11c and an expandable solder means 14 is shown inserted into the openings. The expandable solder means 14 is shown having a spring 27 encased therein, the spring being compressed.

Solder balls 10 are selected from a solder which has a melting point (liquidus) lower than the melting point of the solder paste used to make the expandable solder bumps. Solder balls 10 have a height greater than expandable bumps 14 and extend above the top surface of graphite boat 11, while expandable bumps 14 are level with the top of the boat. Substrate 16 is urged downward against the tops of balls 10 by spring 9 affixed to fixture 8.

Figure 2B:
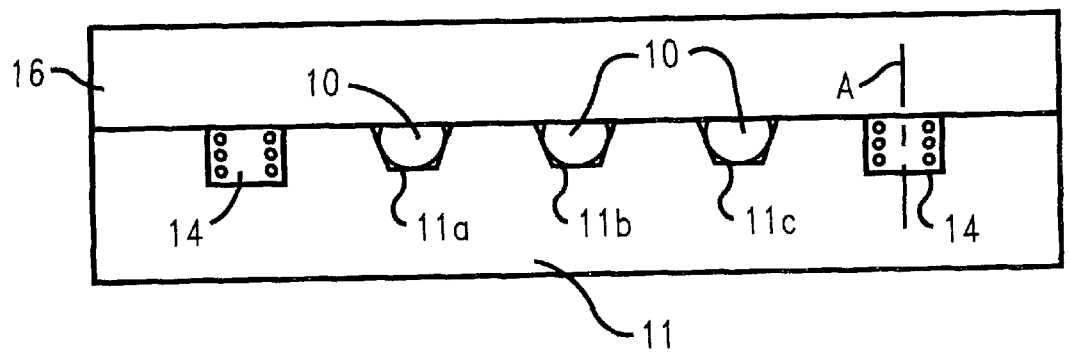

In FIG. 2B there is shown substrate 16 pressed down fully against the top of graphite boat 11 after the solder balls are reflowed by heating to above the melting points of both the solder balls 10 and expandable solder bumps 14. During reflow, the spring 27 in the expandable solder bumps 14 is constrained in its compressed state by cavities 11d, 11e. After reflow, the solder balls 10 are shown collapsed within openings 11a, 11b, 11c, while the upper surfaces of expandable solder bumps in openings 11d, 11e contact the lower surface of substrate 16. Upon cooling and removal from boat 11, the reflowed solder balls 18 and expandable solder bumps are all attached to the lower surface of substrate 16 (FIG. 2C).

Figure 2C:
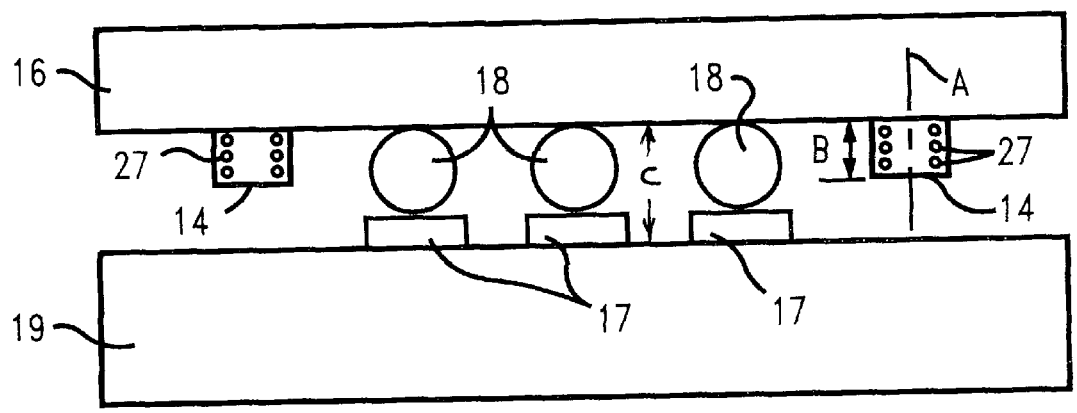

As also seen in FIG. 2C, the substrate with attached balls 18 and expandable solder bumps 14 may be positioned over a second substrate such as a circuit board or card 19. Paste 17 on substrate 19 receives and contacts the lower end of reflowed solder balls 18 as the substrates have a spacing C between the facing surfaces thereof. The height of expandable solder means 14 is shown as B, which is still less than the height C of solder balls 18. Upon heating to a temperature sufficient to reflow only the solder balls 18 (FIG. 2D) substrate 16 moves downward toward substrate 19 as the solder balls melt. Since the reflow temperature in this instance is less than the reflow (liquidus) temperature of expandable solder bumps 14, the bumps 14 are still solid and act to prevent further collapse of substrate 16 below height B.

Figure 2D:
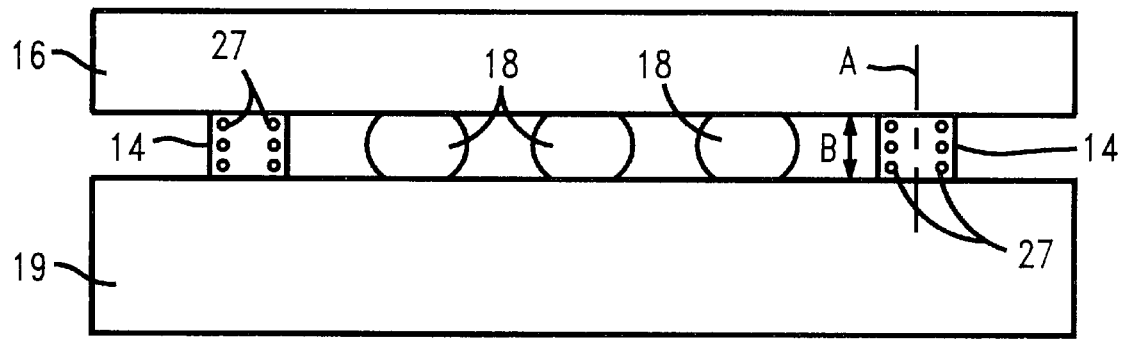
Figure 2E:
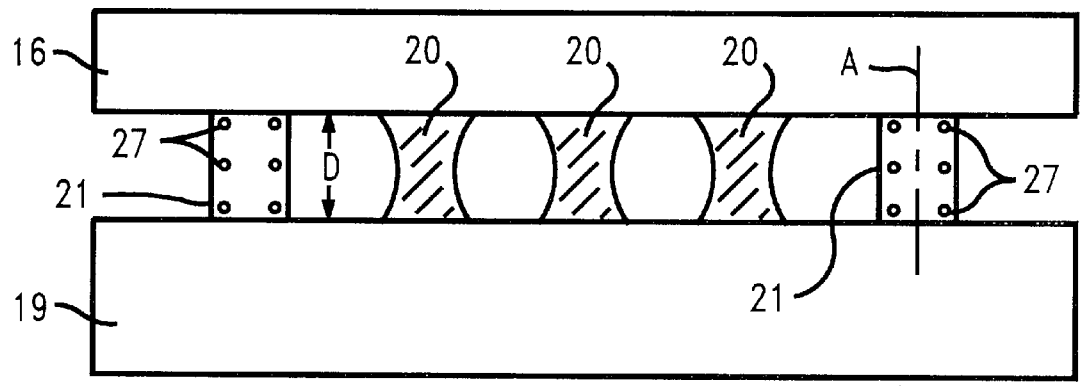

Subsequent to the step shown in FIG. 2D, FIG. 2E shows the assembly after the temperature is raised further to above the reflow temperature of the expandable solder means 14. FIG. 2E shows stretching of solder joint 18 by reflowing the assembly of FIG. 2D at a temperature so that the expandable solder means 14 softens and expands with the spring 27 elongating and forcing apart substrates 16 and 19 forming expansion means expanded solder joint 21. The stretched height between substrate 16 and substrate 19 is shown as D which is greater than the substrates' initial spacing B between the unstretched substrates of FIG. 2D. The elongated solder joint 20 formed by stretching of the double truncated spherical solder joint 18 is shown as an hour-glass shape. Expansion means expanded solder joint 21 is shown having a spring encased therein, which spring in joint 21 is elongated compared to the compressed spring shown as 14. Expansion of expandable solder means 14 is generally meant to expand along axis A of FIGS. 2A–2E. This expansion direction is essentially transverse to the planes of substrates 16 and 19.

Figure 3:
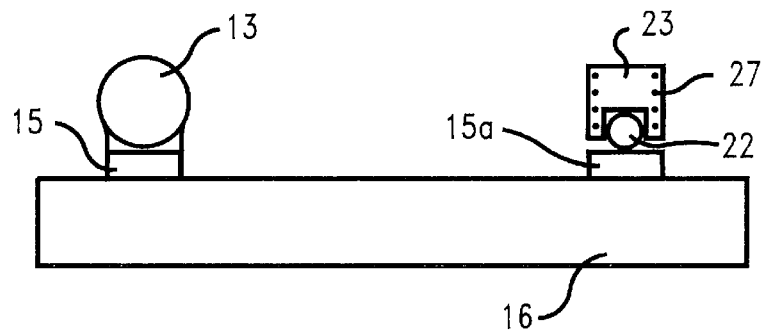
FIG. 3 shows in sectional elevational view another exemplary expandable solder bump of the invention on a substrate to be interconnected.

FIG. 3 shows a substrate 16 having a solder ball 13 connected by reflow to pad 15. Another exemplary expandable solder means 23 having the shape of an inverted U is shown secured to solder ball or other projection 22 on pad 15*a*. In this embodiment the expandable solder means 23 may be secured to solder ball 22 with a friction fit. This substrate may be used as in Figs. 1A–1C to form an elongated solder structure in an electronic module.

Figure 4A:
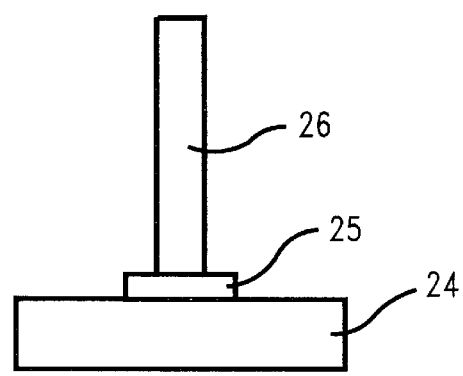
FIGS. 4A–4C show in sectional elevational views the fabrication of an expandable solder bump of the invention.
Figure 4B:
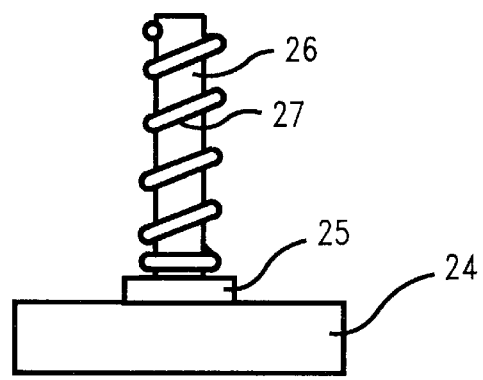
Figure 4C:
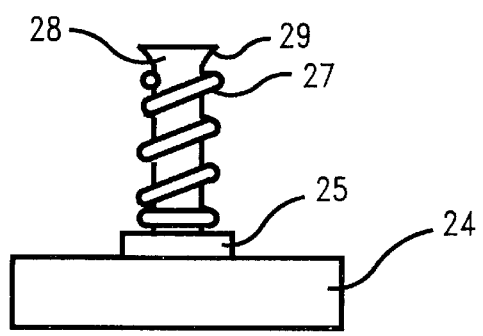

FIG. 4A shows a conventional solder column 26 secured to pad 25 of substrate 24. A spring or other expandable means 27 in preferably a relaxed state is disposed around solder column 26 as shown in FIG. 4B. The solder column is then deformed such as by heating and compressing to form a shortened solder column 28 having an outwardly projecting upper lip 29, as shown in FIG. 4C. The spring 27 is now in a compressed state and held in the compressed state by lip 29 to form an expandable solder bump 14. The spring 27 of expandable solder bump 14' will be activated and elongated to stretch a solder joint as discussed above when solder column 28 is reflowed. The compressed spring or other expansion means is sized with the length of the solder bump encasing the spring to provide the necessary separation force required to lengthen the solder joints to the desired elongated height.

Figure 6:
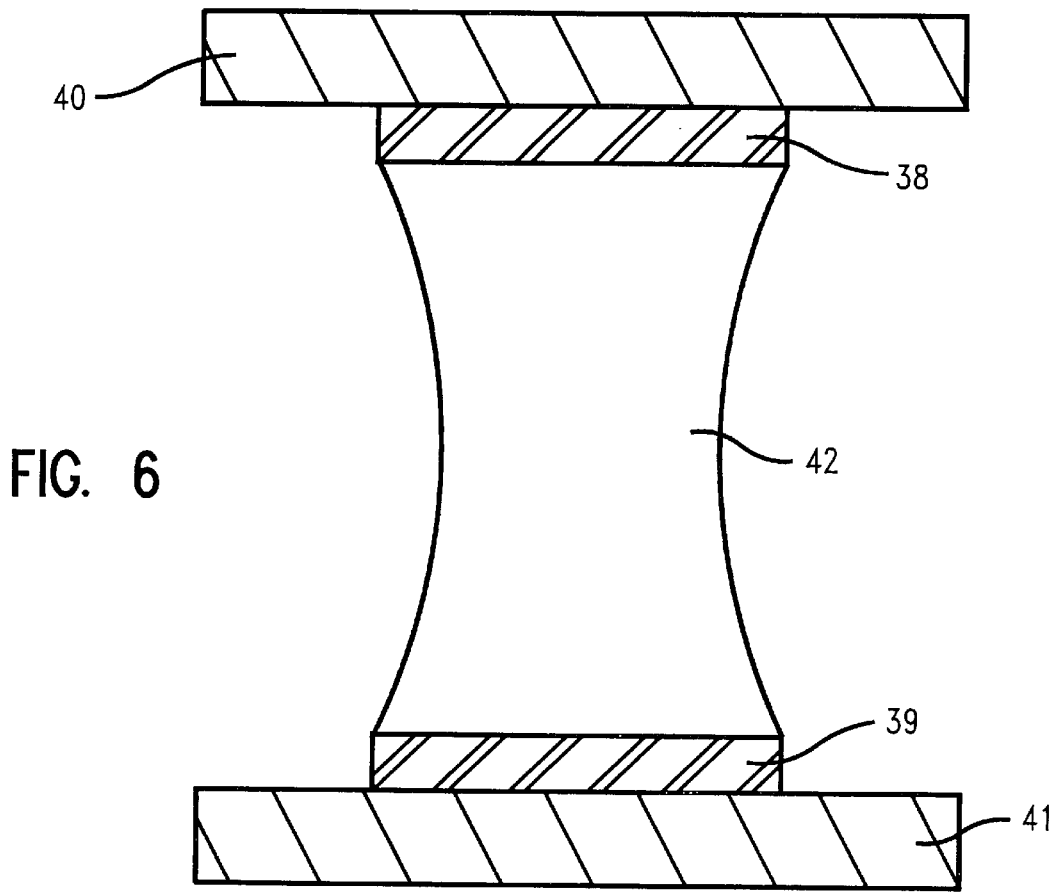
FIG. 6 shows in sectional elevational view an hour-glass shaped solder joint made by stretching or elongating the solder joint of FIG. 5.
Figure 5:
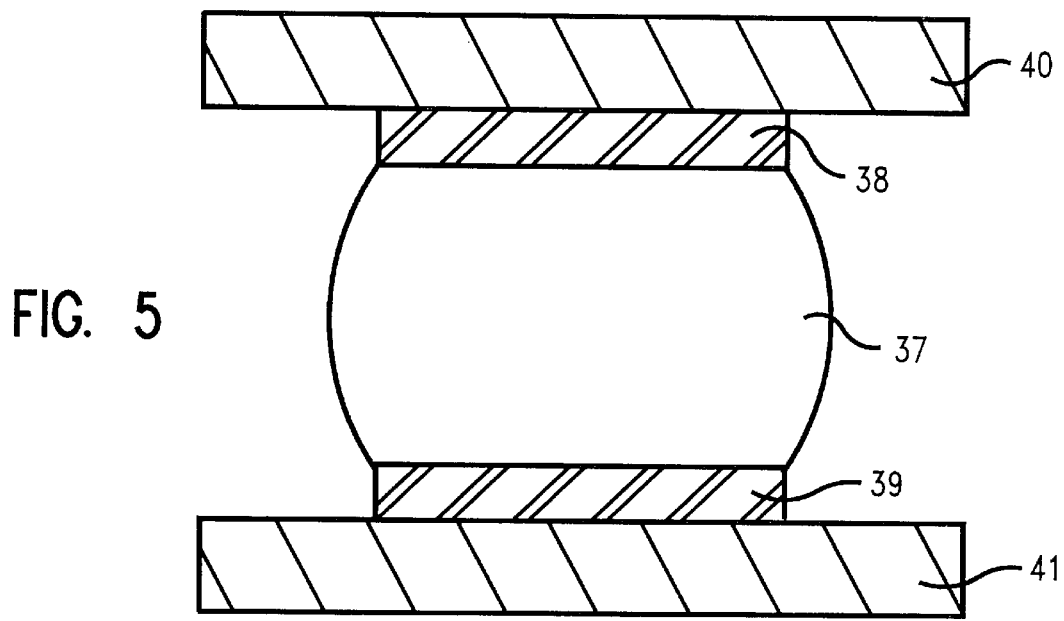
FIG. 5 shows in sectional elevational view a prior art double truncated spherical solder joint.

FIG. 5 shows a typical double truncated spherical solder bump. A substrate 40 having a pad 38 is interconnected to substrate 41 having pad 39 by solder interconnection 37. In FIG. 6, the solder interconnection 37 of FIG. 5 is shown stretched to form an hour-glass shaped solder joint 42.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An article of manufacture for use in fabrication of an electronic module having solder interconnected substrates comprising:
    a first substrate;
    a plurality of first solder bumps on one side of said first substrate;
    a plurality of expandable solder bumps on said one side of said first substrate, said expandable solder bumps comprising a solder structure having integrally encased therein expansion means in a compressed state, said expansion means being adapted to expand from the compressed state when the expandable solder bumps are reflowed.

2. The article of claim 1 wherein said first solder bumps have a first melting point and said expandable solder bumps have a second melting point, said second melting point of said expandable solder bumps being greater than said first melting point of said first solder bumps.

3. The article of claim 1 wherein said expandable solder bumps have an initial height less than that of said first solder bumps.

4. The article of claim 1 wherein said expansion means comprises a spring.

5. The article of claim 1 wherein said solder structure has a cylindrical configuration.

6. An article of manufacture for use in fabrication of an electronic module having solder interconnected substrates comprising:
    a first substrate;
    a plurality of first solder bumps on one side of said first substrate, said first solder bumps having a first melting point;
    a plurality of expandable solder bumps on said one side of said first substrate, said expandable solder bumps comprising a solder structure having integrally encased therein a spring in a compressed state, said expandable solder bumps having a second melting point greater than said first melting point of said first solder bumps, said spring being adapted to expand from the compressed state when the expandable solder bumps are reflowed.

7. The article of claim 6 wherein said expandable solder bumps have an initial height less than that of said first solder bumps.

8. The article of claim 6 wherein said solder structure has a cylindrical configuration.

9. An electronic module having solder interconnected substrates comprising:
    a first substrate;
    a second substrate;
    a plurality of first solder joints connecting said first and second substrates, said solder joints having an elongated configuration after reflow from an initial height;
    a plurality of expandable solder joints connecting said first and second substrates, said expandable solder joints having integrally encased therein expansion means in a solder structure, said expansion means being in an expanded state after reflow from an initial height.

10. The module of claim 9 wherein said first solder joints have a first melting point and said expandable solder joints have a second melting point, said second melting point of said expandable solder joints being greater than said first melting point of said first solder joints.

11. The module of claim 9 wherein said expansion means comprises a spring.

12. The module of claim 9 wherein said solder structure has a cylindrical configuration.

13. A method of forming an expandable solder bump for an electronic module comprising the steps of:
    a) providing a cavity in a mold having a desired height and configuration for an expandable solder bump;
    b) filling said cavity with a solder paste;
    c) inserting a spring into said cavity, said spring having an uncompressed height greater than the height of said cavity;

d) compressing said spring to a height no greater than the height of said cavity;

e) heating the compressed spring and solder paste in said cavity to melt said solder paste; and d) cooling said spring and solder paste to solidify said solder paste and form a solder structure having integrally encased therein said spring in a compressed state.

14. A method of forming an elongated solder joint between two solder interconnected substrates in an electronic module comprising the steps of:

a) forming a plurality of first solder bumps on one side of a first substrate, said solder bumps having a first melting point and a first height;

b) forming a plurality of expandable solder bumps on said one side of said first substrate, said expandable solder bumps comprising a solder structure having integrally encased therein expansion means in a compressed state, said expansion means being adapted to expand from the compressed state when the expandable solder bumps are reflowed, said expandable solder bumps having a second melting point, said second melting point of said expandable solder bumps being greater than said first melting point of said first solder bumps, said expandable solder bumps have an initial height less than that of said first solder bumps;

c) positioning a second substrate to align with and contact the first solder bumps of said first substrate;

d) heating the first solder bumps to a temperature less than the melting point of said expandable solder bumps to reflow the first solder bumps to form a first solder interconnection between the first substrate; and e) heating the expandable solder bumps and the first solder bumps to a temperature above the melting point of said expandable solder bumps to reflow and expand the expandable solder bumps thereby increasing the height of the first solder interconnection and forming an elongated solder joint between the substrates.

15. The method of claim 14 wherein in step (e) the first solder bumps are expanded to form an hour-glass shape after reflow.

16. The method of claim 14 wherein in step (b) said expandable solder bumps are formed on said first substrate by heating said expandable solder bumps while said solder structure is in contact with said one side and said expansion means is constrained in a compressed state.

17. The method of claim 14 wherein in step (a) said first solder bumps are formed on said first substrate by heating said first solder bumps to a temperature less than said second melting point of said expandable solder bumps.

* * * * *